United States Patent
Lee et al.

(10) Patent No.: US 11,245,082 B2
(45) Date of Patent: Feb. 8, 2022

(54) COATING LIQUID AND FILM AND THIN FILM TRANSISTOR AND ELECTRONIC DEVICE

(71) Applicant: Samsung Electronics Co., Ltd., Suwon-si (KR)

(72) Inventors: Eun Kyung Lee, Seoul (KR); Jiyoung Jung, Seoul (KR); Myong Jong Kwon, Suwon-si (KR); Jeong Il Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 195 days.

(21) Appl. No.: 16/508,907

(22) Filed: Jul. 11, 2019

(65) Prior Publication Data

US 2020/0235324 A1 Jul. 23, 2020

(30) Foreign Application Priority Data

Jan. 21, 2019 (KR) .................. 10-2019-0007796

(51) Int. Cl.
| | |
|---|---|
| *H01L 51/05* | (2006.01) |
| *C09D 183/08* | (2006.01) |
| *C08G 77/24* | (2006.01) |
| *B32B 27/28* | (2006.01) |
| *H01L 21/02* | (2006.01) |
| *C09D 183/04* | (2006.01) |
| *C08G 77/04* | (2006.01) |

(52) U.S. Cl.
CPC ........ *H01L 51/0533* (2013.01); *B32B 27/283* (2013.01); *C08G 77/24* (2013.01); *C09D 183/04* (2013.01); *C09D 183/08* (2013.01); *H01L 21/02118* (2013.01); *C08G 77/04* (2013.01)

(58) Field of Classification Search
USPC .......... 106/287.13, 287.14, 287.16
See application file for complete search history.

(56) References Cited

U.S. PATENT DOCUMENTS

| | | | |
|---|---|---|---|
| 8,030,644 B2 | 10/2011 | Shin et al. | |
| 9,583,540 B2 | 2/2017 | Simonato et al. | |
| 10,038,155 B2 | 7/2018 | Jung et al. | |
| 2006/0154091 A1* | 7/2006 | Schmidt | C08L 83/08 428/447 |
| 2006/0234430 A1* | 10/2006 | Liu | H01L 51/0537 438/149 |
| 2008/0252793 A1* | 10/2008 | Choi | H04N 5/4403 348/734 |
| 2009/0285993 A1* | 11/2009 | Kang | C08L 83/08 427/380 |
| 2010/0090200 A1* | 4/2010 | Wu | H01L 51/0529 257/40 |
| 2012/0003485 A1 | 1/2012 | Habich et al. | |
| 2016/0032141 A1* | 2/2016 | Maghsoodi | H01L 31/02168 428/220 |
| 2018/0123064 A1 | 5/2018 | Choi et al. | |

FOREIGN PATENT DOCUMENTS

| | | |
|---|---|---|
| JP | 2012-519930 A | 8/2012 |
| KR | 2007-0059283 A | 6/2007 |
| KR | 2014-0051956 A | 5/2014 |
| KR | 2016-0033262 A | 3/2016 |
| KR | 2018-0046257 A | 5/2018 |

* cited by examiner

*Primary Examiner* — Marc S Zimmer
(74) *Attorney, Agent, or Firm* — Harness, Dickey & Pierce, P.L.C.

(57) ABSTRACT

Disclosed are a coating liquid including polyorganosiloxane represented by Chemical Formula 1, a film obtained therefrom, a stacked structure including the same, a thin film transistor, and an electronic device.

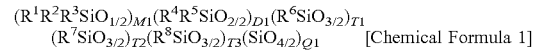

[Chemical Formula 1]

In Chemical Formula 1, $R^1$ to $R^8$, M1, D1, T1 to T3, and Q1 are the same as defined in the detailed description.

9 Claims, 2 Drawing Sheets

100

COATING LIQUID AND FILM AND THIN FILM TRANSISTOR AND ELECTRONIC DEVICE

CROSS-REFERENCE TO RELATED APPLICATION

This application claims priority to and the benefit of Korean Patent Application No. 10-2019-0007796, filed in the Korean Intellectual Property Office on Jan. 21, 2019, the entire contents of which are incorporated herein by reference.

BACKGROUND

1. Field

A coating liquid, a film, a thin film transistor, and an electronic device are disclosed.

2. Description of the Related Art

A flat panel display, such as a liquid crystal display (LCD), an organic light emitting diode (OLED) display, an electrophoretic display, and the like, includes a pair of electric field-generating electrodes and an electrical optical active layer interposed therebetween. The liquid crystal display (LCD) includes a liquid crystal layer as an electrical optical active layer, and the organic light emitting diode (OLED) display includes an organic emission layer as an electrical optical active layer.

One of the pairs of the electric field-generating electrodes is commonly connected to a switching device and receives an electrical signal, and the electrical optical active layer transforms the electrical signal into an optical signal and thus displays an image.

The flat panel display includes a three-terminal element of a thin film transistor (TFT) as a switch, and it also includes a gate line transferring a scan signal for controlling the thin film transistor and a data line transferring a data signal to be applied to a pixel electrode.

The thin film transistor may be determined by various factors, one of which is interface characteristics between a semiconductor and a gate insulator.

SUMMARY

An embodiment provides a coating liquid that may be applicable for improved surface characteristics.

Another embodiment provides a film having improved surface characteristics.

Yet another embodiment provides a thin film transistor having improved performance.

Still another embodiment provides an electronic device including the film or the thin film transistor.

According to an embodiment, a coating liquid includes a polyorganosiloxane represented by Chemical Formula 1.

  [Chemical Formula 1]

In Chemical Formula 1, $R^1$ to $R^6$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 heteroaryl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 epoxy group, a substituted or unsubstituted C1 to C30 carbonyl group, a substituted or unsubstituted C1 to C30 carboxyl group, a substituted or unsubstituted amide group, a hydroxyl group, or a combination thereof, $R^7$ is a C8 to C30 alkyl group or a fluoroalkyl group, $R^8$ is hydrogen or a C1 to C3 alkyl group, $0 \leq M1 < 1$, $0 \leq D1 < 1$, $0 \leq T1 \leq 0.5$, $0 < T2 \leq 0.5$, $0 \leq T3 \leq 0.5$, $0 \leq Q1 < 1$, and $M1 + D1 + T1 + T2 + T3 + Q1 = 1$.

In some embodiments, $R^7$ may be represented by Chemical Formula 1a.

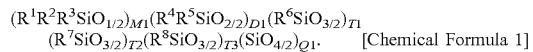  [Chemical Formula 1a]

In Chemical Formula 1a, $R^a$ is hydrogen or $CF_3$, n1 and n2 are independently an integer ranging from 0 to 30, $8 \leq n1 + n2 \leq 30$, and

* is a linking point with Si.

In some embodiments, n1 may be an integer of 5 to 20, and n2 may be an integer of 0 to 4.

In some embodiments, Ra may be $CF_3$ and n1 may be an integer of 5 to 20.

In some embodiments, the polyorganosiloxane may have a weight average molecular weight of about 1,000 to about 5,000.

In some embodiments, the coating liquid may further include a solvent and the polyorganosiloxane may be included in an amount of about 1 wt % to about 20 wt % based on an amount of the coating liquid.

According to another embodiment, a film includes a cured product of the coating liquid.

In some embodiments, the film may have a contact angle of about 100 degrees to about 130 degrees.

According to another embodiment, a stacked structure includes a substrate and the film.

According to another embodiment, an electronic device includes the stacked structure.

According to another embodiment, an electronic device includes a cured product of the coating liquid.

According to another embodiment, a thin film transistor includes a gate electrode, a semiconductor layer overlapping with the gate electrode, a gate insulator between the gate electrode and the semiconductor layer, an auxiliary layer between the gate insulator and the semiconductor layer and including polyorganosiloxane represented by Chemical Formula 1 or a cured product thereof, and a source electrode and a drain electrode electrically connected to the semiconductor layer.

In some embodiments, the auxiliary layer may contact the semiconductor layer and the gate insulator, respectively.

In some embodiments, the auxiliary layer may have a thickness of about 10 nm to about 200 nm.

In some embodiments, the semiconductor layer may include an organic semiconductor.

According to another embodiment, an electronic device includes the thin film transistor.

A coating liquid and film having improved surface characteristics may be provided and thus improved performance may be achieved.

DETAILED DESCRIPTION

Figure 1:
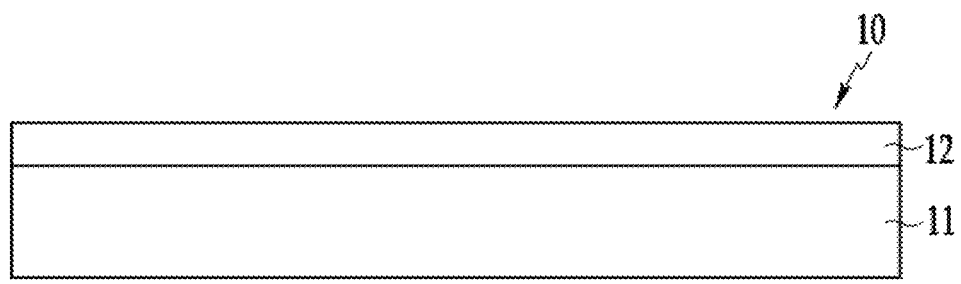
FIG. 1 is a schematic cross-sectional view showing a stacked structure according to an embodiment.

Example embodiments will hereinafter be described in detail, and may be easily performed by a person having an ordinary skill in the related art. However, this disclosure may be embodied in many different forms and is not to be construed as limited to the embodiments set forth herein.

As used herein, when a definition is not otherwise provided, "substituted" may refer to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heteroaryl group, a C3 to C30 heterocycloalkyl group, and a combination thereof.

As used herein, when a definition is not otherwise provided, "hetero" may refer to inclusion of one to four heteroatoms selected from N, O, S, Se, Te, Si, and P.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

Hereinafter, a coating liquid according to an embodiment is described.

The coating liquid according to an embodiment includes at least one polyorganosiloxane.

The polyorganosiloxane may include a siloxane structure unit having a —Si—O—Si bond and may be an organic/inorganic compound of a three-dimensional reticular structure having a $SiO_{3/2}$ moiety. For example, the $SiO_{3/2}$ moiety may have a hydrophobic functional group, for example a long-chain alkyl group or fluoroalkyl group.

For example, at least one polyorganosiloxane may be represented by Chemical Formula 1.

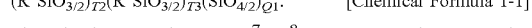   [Chemical Formula 1]

In Chemical Formula 1, $R^1$ to $R^6$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 heteroaryl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 epoxy group, a substituted or unsubstituted C1 to C30 carbonyl group, a substituted or unsubstituted C1 to C30 carboxyl group, a substituted or unsubstituted amide group, a hydroxyl group, or a combination thereof, $R^7$ is a C8 to C30 alkyl group or a fluoroalkyl group, $R^8$ is hydrogen or a C1 to C3 alkyl group, $0 \leq M1 < 1$, $0 \leq D1 < 1$, $0 \leq T1 \leq 0.5$, $0 < T2 \leq 0.5$, $0 \leq T3 \leq 0.5$, $0 \leq Q1 < 1$, and $M1+D1+T1+T2+T3+Q1=1$.

In Chemical Formula 1, the moiety represented by $R^7SiO_{3/2}$ may have a hydrophobic functional group, and for example $R^7$ may be a C8 to C30 long-chain alkyl group or fluoroalkyl group.

For example, $R^7$ may be represented by Chemical Formula 1a.

   [Chemical Formula 1a]

In Chemical Formula 1a, $R^a$ is hydrogen or $CF_3$, n1 and n2 are independently an integer ranging from 0 to 30, and $8 \leq n1+n2 \leq 30$, and

* is a linking point with Si.

For example, n1 may be an integer of 1 to 20.

For example, n1 may be greater than n2 and for example n1 may be an integer of 5 to 20 and n2 may be an integer of 0 to 4.

For example, the moiety represented by $R^7SiO_{3/2}$ may have a hydrophobic functional group including a perfluoroalkyl group at the terminal end, and Ra may be for example $CF_3$.

For example, $R^a$ may be $CF_3$ and n1 may be greater than n2.

For example, $R^a$ may be $CF_3$ and n1 may be an integer of 5 to 20.

For example, $R^a$ may be $CF_3$ and n1 may be an integer of 5 to 20 and n2 may be an integer of 0 to 4.

For example, $R^a$ may be $CF_3$ and n1 may be an integer of 5 to 15 and n2 may be an integer of 1 to 3.

In Chemical Formula 1, the moiety represented by $R^8SiO_{3/2}$ may have hydrogen or a short-chain alkyl group, and for example $R^8$ may be hydrogen, a methyl group, an ethyl group, or a propyl group.

For example, the polyorganosiloxane may be represented by Chemical Formula 1-1.

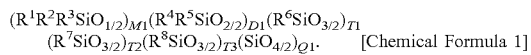   [Chemical Formula 1-1]

In Chemical Formula 1-1, $R^7$, $R^8$, T2, T3, and Q1 are the same as described above.

The polyorganosiloxane may be effectively applied to surfaces that require hydrophobic properties to effectively modify the surfaces by including a long-chain hydrophobic functional group and may improve flexibility by providing flexibility of the cured product of the coating liquid. In addition, the polyorganosiloxane may optionally further include a short-chain alkyl group to provide a hard film upon curing to improve mechanical characteristics such as scratch characteristics.

The polyorganosiloxane may have a weight average molecular weight of about 1,000 to about 5,000.

The polyorganosiloxane may further include at least one polyorganosiloxane having a different structure from the above polyorganosiloxane. For example, the coating liquid may further include, for example dimethylpolysiloxane, methylphenylpolysiloxane, cyclic dimethylpolysiloxane, methylhydrogen polysiloxane, a polyether modified dimethylpolysiloxane copolymer, a polyester modified dimethylpolysiloxane copolymer, fluoro dimethylpolysiloxane copolymer, an amino modified dimethylpolysiloxane copolymer, or a combination thereof, but is not limited thereto.

The polyorganosiloxane may be included in an amount of about 1 wt % to about 20 wt % based on an amount of the coating liquid.

The coating liquid may further include various additives, such as a surface-characteristic controlling agent, a reaction initiator, a polymerization accelerator, an ultraviolet (UV) absorber, or an antistatic agent, but is not limited.

The reaction initiator may be for example a photocurable reaction initiator or a thermally curable reaction initiator. The reaction initiator may be for example a cation polymerization initiator, for example, a cation photopolymerization initiator or a cation thermal curing initiator.

The cation photopolymerization initiator may be for example a compound including an onium salt, for example a compound including diphenyliodonium, 4-methoxydiphenyliodonium, bis(4-methylphenyl)iodonium, bis(4-t-butylphenyl)iodonium, bis(dodecylphenyl)iodonium, triphenylsulfonium, diphenyl-4-thiophenoxyphenylsulfonium, bis[4-diphenylsulfonio]phenyl]sulfide, bis[4-(di(4-(2-hydroxyethyl)phenyl)sulfonio)-phenyl]sulfide, or a combination thereof, but is not limited thereto. The compound including the onium salt may release acid after a photoreaction.

The ultraviolet (UV) absorber may be for example a benzophenone-based compound, a triazine-based compound, a benzotriazole-based compound, a metal oxide, or a combination thereof, but is not limited thereto. The ultraviolet (UV) absorber may be included in trace amounts.

The antistatic agent may be for example a lithium salt of pyridinium, imidazolium, phosphonium, ammonium, bis (trifluoromethane sulfonyl)imide, or bis(trifluorosulfonyl) imide, or a combination thereof, but is not limited thereto.

The additives may be included in an amount of about 0 wt % to about 20 wt % based on an amount of the coating liquid.

The coating liquid may further include a solvent capable of dissolving or dispersing the above components.

The solvent is not particularly limited as long as it may dissolve and/or disperse the above components. However, the solvent may be for example water; an alcohol based solvent such as methanol, ethanol, n-propylalcohol, isopropylalcohol, n-butanol, isobutanol, t-butanol, propylene glycol, propylene glycolmethylether, ethylene glycol, and the like; an aliphatic hydrocarbon solvent such as hexane, heptane and the like; an aromatic hydrocarbon solvent such as toluene, pyridine, quinoline, anisole, mesitylene, xylene, and the like; a ketone based solvent such as methyl isobutyl ketone, 1-methyl-2-pyrrolidinone (NMP), cyclohexanone, acetone, and the like; an ether based solvent such as tetrahydrofuran, isopropyl ether, and the like; an acetate based solvent such as ethyl acetate, butyl acetate, propylene glycol methylether acetate, and the like; an amide based solvent such as dimethyl acetamide, dimethyl formamide (DMF), and the like; a nitrile-based solvent such as acetnitrile, benzonitrile, and the like; and a mixture of the foregoing solvents, but is not limited thereto.

The solvent may be included in a balance amount excluding the above solid components.

The coating liquid may be formed by coating, drying and curing to form a cured product such as a film.

The coating liquid may be for example coated with a solution process, for example a spin coating, a slit coating, a bar coating, a spray coating, an inkjet printing, and the like, but not limited thereto.

The drying may be for example once or more than once performed at 50° C. to about 150° C.

The curing may be photo curing and/or thermal curing. The photo curing may for example use a xenon lamp, a high pressure mercury lamp, a metal halide lamp, and the like and a light dose or a radiation time may be controlled as needed. The thermal curing may be for example performed at about 80° C. to about 250° C., and the number and time of heat treatment may be controlled as needed.

Additional heat-treatment may be available after curing and the heat-treatment may be performed for example at about 50° C. to about 200° C., for example about 70° C. to about 180° C. and for example at about 80° C. to about 160° C.

The obtained cured product may be transparent.

The obtained cured product may be a thin film. For example, it may be included as at least one of an insulation layer, an intermediate layer, an over coating layer, a protective layer, a surface-modifying layer, and an auxiliary in an electronic device such as a thin film transistor, a photoelectric device, a light emitting device, a solar cell, or sensor. The thin film may have a thickness of, for example about 10 nm to about 100 μm, about 10 nm to about 80 μm, about 10 nm to about 60 μm, about 10 nm to about 50 μm, about 10 nm to about 30 μm, about 10 nm to about 20 μm, about 10 nm to about 10 μm, about 10 nm to about 10 μm, about 10 nm to about 500 nm, about 10 nm to about 300 nm, or about 10 nm to about 200 nm.

The obtained cured product may be produced, for example, as a film-shaped article.

The article may have a thickness of, for example about 10 nm to about 500 μm, about 10 nm to about 300 μm, about 10 nm to about 200 μm, about 10 nm to about 150 μm, or about 10 nm to about 100 μm.

A thin film or an article (hereinafter referred to as 'a film') obtained from the coating liquid may be formed on a substrate to form a stacked structure. The stacked structure may be effectively applied to fields requiring hydrophobicity, for example a window for a display device.

FIG. 1 is a schematic cross-sectional view showing a stacked structure according to an embodiment.

Referring to FIG. 1, a stacked structure 10 according to an embodiment includes a substrate 11 and a film 12 disposed on the substrate 11.

The substrate 11 may be a glass or polymer substrate and may include, for example polyimide, polyamide, polyamideimide, polyethyleneterephthalate, polyethylenenaphthalene, polymethylmethacrylate, polycarbonate, a copolymer thereof, or a combination thereof, but is not limited thereto.

The film 12 may be obtained by curing the coating liquid. The film may be obtained by directly coating the coating liquid on the substrate 11 followed by drying and curing it or by coating the coating liquid a separate substrate (not shown) followed by drying and curing it and then transferring the film on the substrate 11.

The film 12 includes the aforementioned polyorganosiloxane. Thus, the film 12 may be a hydrophobic surface modifying layer with improved flexibility and mechanical characteristics.

For example, the film 12 may have a high contact angle. Thus, the film 12 may exhibit good slipping properties and water repellency. The film 12 may have a contact angle of greater than or equal to about 100 degrees, for example about greater than or equal to about 102 degrees, greater than or equal to about 105 degrees, greater than or equal to about 110 degrees, or greater than or equal to about 112 degrees. The film 12 may have a contact angle of about 100 degrees to about 130 degrees, for example about 102 degrees to about 130 degrees, about 105 degrees to about 130 degrees, about 110 degrees to about 130 degrees, or about 112 degrees to about 130 degrees. Herein, the contact angle may be measured by using a Sessile drop technique. The contact angle is measured by using water as liquid and a Drop shape analyzer (DSA100, KRUSS, Germany) as a measuring equipment. The contact angle may be measured by dropping a desired (and/or alternatively predetermined) amount (about 3 ul) of water on the film.

The film 12 may be a functional film such as for example a hard coating layer, an anti-fingerprint coating layer and/or a scratch resistance layer.

The stacked structure 10 may further include at least one layer between the substrate 11 and the film 12. The stacked structure 10 may be a transparent film, for example a transparent flexible film.

For example, the film or the stacked structure may be attached on the display panel. Herein, the display panel and the film or the stacked structure may be directly bonded or may be bonded by interposing an adhesive. The display panel may be for example a liquid crystal panel or an organic light emitting panel, but is not limited thereto. The film or stacked structure may be disposed on the side of an observer.

Figure 2:
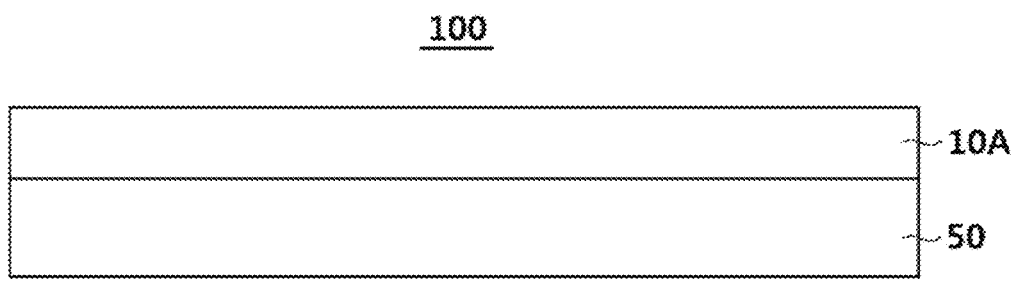
FIG. 2 is a cross-sectional view of an electronic device according to an embodiment.

FIG. 2 is a cross-sectional view of an electronic device according to an embodiment.

The electronic device may be for example a display device.

Referring to FIG. 2, a display device 100 according to an embodiment includes a display panel 50 and a functional film 10A.

The display panel 50 may be for example an organic light emitting display panel or a liquid crystal display panel, for example a bendable display panel, a foldable display panel, or a rollable display panel.

The functional film 10A may include the film or stacked structure and may be disposed on the side of an observer. Another layer may be further disposed between the display panel 50 and the functional film 10A and may include for example a monolayer or plural layers of polymer layer (not shown) and optionally a transparent adhesive layer (not shown).

Figure 3:
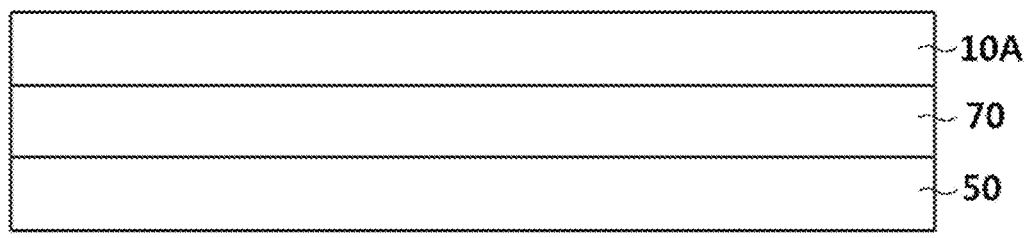
FIG. 3 is a cross-sectional view of an electronic device according to another embodiment.

FIG. 3 is a cross-sectional view of an electronic device according to another embodiment.

The electronic device may be for example a display device.

Referring to FIG. 3, a display device 200 according to an embodiment includes a display panel 50, a functional film 10A, and a touch screen panel 70 disposed between the display panel 50 and the functional film 10A.

The display panel 50 may be for example an organic light emitting display panel or a liquid crystal display panel, for example a bendable display panel, a foldable display panel, or a rollable display panel.

The functional film 10A may include the film or stacked structure and may be disposed on the side of an observer.

The touch screen panel 70 may be disposed adjacent to each of the functional film 10A and the display panel 50 to recognize the touched position and the position change when is touched by a human hand or an object through the functional film 10A and then to output a touch signal. The driving module (not shown) may monitor a position where is touched from the output touch signal; recognize an icon marked at the touched position, and control to carry out functions corresponding to the recognized icon, and the function performance results are displayed on the display panel 50.

Another layer may be further disposed between the touch screen panel 70 and functional film 10A and may include for example a monolayer or plural layers of polymer layer (not shown) and optionally a transparent adhesive layer (not shown).

Another layer may be further interposed between the touch screen panel 70 and the display panel 50 and may include for example a monolayer or plural layers of polymer layer (not shown) and optionally a transparent adhesive layer (not shown).

The functional film 10A including the aforementioned film or stacked structure may be applied to a variety of electronic devices such as a display device, for example a smart phone, a tablet PC, a camera, a touch screen device, and so on, but is not limited thereto.

The thin film obtained from the coating liquid may be for example applicable to a thin film transistor.

Figure 4:
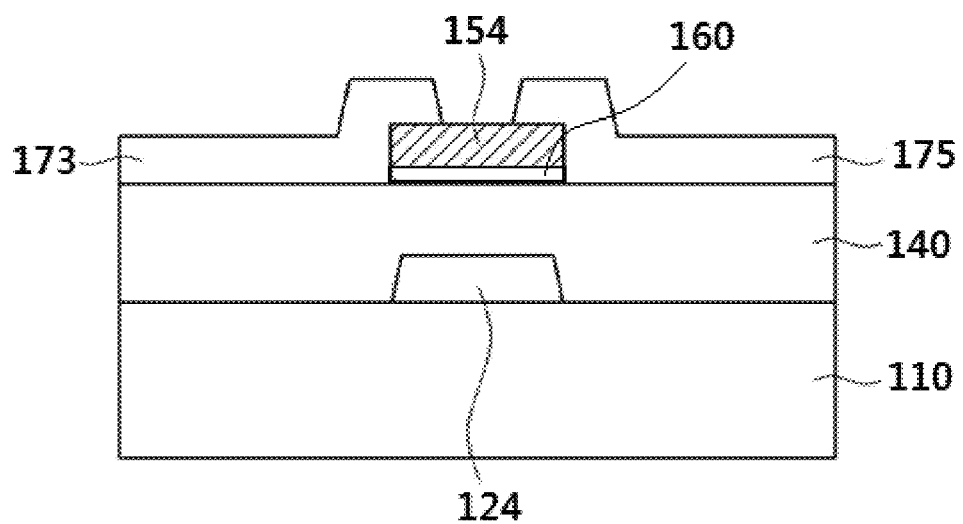
FIG. 4 is a cross-sectional view of a thin film transistor according to an embodiment.

FIG. 4 is a cross-sectional view of a thin film transistor according to an embodiment.

Referring to FIG. 4, a thin film transistor according to an embodiment includes a substrate 110, a gate electrode 124, a gate insulator 140, a semiconductor layer 154, an auxiliary layer 160, a source electrode 173, and a drain electrode 175.

The substrate 110 may be for example a transparent glass, silicon substrate, or plastic substrate.

The gate electrode 124 is formed on a substrate 110 and is connected to a gate line (not shown) transferring a gate signal. The gate electrode 124 may be made of gold (Au), copper (Cu), nickel (Ni), aluminum (Al), molybdenum (Mo), chromium (Cr), tantalum (Ta), titanium (Ti), an alloy thereof, or a combination thereof.

The semiconductor layer 154 may overlap with the gate electrode 124 and may include a semiconductor material. The semiconductor material may be for example an organic semiconductor material.

The gate insulator 140 is disposed between the gate electrode 124 and the semiconductor layer 154. The gate insulating layer 140 may be made of an organic material and/or an inorganic material. Examples of the organic material may include a soluble polymer compound such as a polyvinyl alcohol-based compound, a polyimide-based compound, a polyacryl-based compound, a polystyrene-based compound, and benzocyclobutane (BCB), and examples of the inorganic material may include a silicon nitride (SiNx) and a silicon oxide ($SiO_2$).

The auxiliary layer 160 is formed on the gate insulator 140 and is disposed between the gate insulator 140 and the semiconductor layer 154. The auxiliary layer 160 may contact, for example the gate insulator 140 and the semiconductor layer 154, respectively. The auxiliary layer 160 may be obtained by coating, drying, and curing the aforementioned coating liquid. The auxiliary layer 160 may be applied as a surface modifying layer on the gate insulator 140 to hydrophobically modify the surface of the gate insulator 140. Thus, the characteristics of the thin film transistor may be improved by improving interface characteristics between the gate insulator 140 and the semiconductor layer 154.

The source electrode 173 and the drain electrode 175 face each other in the center of the gate electrode 124 and are electrically connected to the semiconductor layer 154. The source electrode 173 is electrically connected to the data line (not shown) transferring the data signal. The source electrode 173 and the drain electrode 175 may include at least one metal of gold (Au), copper (Cu), nickel (Ni), aluminum (Al), molybdenum (Mo), chromium (Cr), tantalum (Ta), titanium (Ti), an alloy thereof, or a combination thereof.

Although FIG. 4 illustrates a bottom gate structured thin film transistor as a thin film transistor according to example embodiments, inventive concepts are not limited thereto, and inventive concepts may be applied to all thin film transistors such as a top gate structured thin film transistor.

The thin film transistor may be applied to a switch or driving device of various electronic devices, and the electronic device may include, for example, a liquid crystal display (LCD), an organic light emitting diode (OLED) display, an electrophoretic display, an organic photoelectric device, and an organic sensor, but is not limited thereto.

Hereinafter, the embodiments are illustrated in more detail with reference to examples. However, these examples are non-limiting examples, and the present disclosure is not limited thereto.

SYNTHESIS EXAMPLES

Synthesis Example 1

1000 g of methyl alcohol is put in a glass reactor equipped with a stirrer, having an agitation function, 300 g (0.59 mol) of 1H,1H,2H,2H-perfluorooctyltriethoxysilane, 244.9 g (1.2 mol) of tetraethyl orthosilicate, and 104.31 g (0.59 mol) of ftriethoxymethylsilane are added thereto, and the mixture is stirred at room temperature for 1 hour. 56 g of a hydrochloric acid aqueous solution having a concentration of 0.1 N is added thereto in a dropwise fashion over 2 hours, and the obtained mixture is additionally stirred at room temperature for 2 hours to induce a hydrolysis reaction. Subsequently, the reactant is heated up to 80° C. and further reacted for 36 hours to cause a condensation and a polymerization and thus obtain polyorganosiloxane. As a result of measuring the polyorganosiloxane in a GPC method, a weight average molecular weight is 2,100, viscosity at 20° C. is 4 cPs, and pH is 7.

The obtained polyorganosiloxane is diluted by adding 650 g of propylene glycol monomethyl ether acetate thereto and then, distilled under reduced pressure and under a condition of 60° C. and 60 cm Hg to remove a byproduct and thus obtain the polyorganosiloxane dispersed in the propylene glycol monomethyl ether acetate.

Synthesis Example 2

1000 g of methyl alcohol is put in a glass reactor equipped with a stirrer, having a stirring function, 460 g (0.90 mol) of 1H,1H,2H,2H-perfluorooctyltriethoxysilane and 187.8 g (0.90 mol) of tetraethyl orthosilicate are added thereto, and the mixture is stirred at room temperature for 1 hour. 56 g of a hydrochloric acid aqueous solution having a concentration of 0.1 N is added thereto in a dropwise fashion over 2 hours and then, additionally stirred over 2 hours at room temperature to induce a hydrolysis reaction. Subsequently, the reactant is heated up to 80° C. and further reacted for 36 hours to cause a condensation and a polymerization and thus obtain polyorganosiloxane. As a result of measuring the obtained polyorganosiloxane in a GPC method, a weight average molecular weight is 2,200, viscosity at 20° C. is 4 cPs, and pH is 7.

The obtained polyorganosiloxane is diluted by adding 650 g of propylene glycol monomethyl ether acetate thereto, distilled under reduced pressure under a condition of 60 cm Hg and 60° C. to remove a byproduct and thus obtain the polyorganosiloxane dispersed in the propylene glycol monomethyl ether acetate.

PREPARATION EXAMPLES

Preparation Example 1

4 wt % of the polyorganosiloxane according to Synthesis Example 1 is added and mixed with propylene glycol monomethyl ether acetate to prepare a coating liquid. Subsequently, the coating liquid is spin-coated on a glass substrate thermally deposited with 20 nm-thick $SiO_2$, dried at 70° C. for 5 minutes, and thermally cured at 185° C. for 1 hour to form a film having a thickness of 16 nm to 105 nm.

Preparation Example 2

A film is formed according to the same method as Preparation Example 1 except that the polyorganosiloxane of Synthesis Example 2 is used instead of the polyorganosiloxane of Synthesis Example 1.

Evaluation I

Each contact angle of the films according to Preparation Examples 1 and 2 is evaluated.

The contact angle is evaluated in a Sessile drop technique method and measured by dropping water respectively on the films and using a Drop shape analyzer (DSA100, KRUSS, Germany).

The results are shown in Table 1.

TABLE 1

|  | Thickness (nm) | Contact angle (degree) |
| --- | --- | --- |
| Preparation Example 1 | 25 | 103 |
|  | 57 | 105 |
|  | 82 | 104.5 |
|  | 105 | 104.5 |
| Preparation Example 2 | 16 | 108 |
|  | 41 | 109 |
|  | 56 | 110 |
|  | 76 | 108.9 |

Referring to Table 1, the films according to Preparation Examples 1 and 2 show a high contact angle and thus have hydrophobicity.

EXAMPLE

Example 1

First, the coating liquid of Synthesis Example 1 is spin-coated on a washed silicon wafer substrate covered with 3000 Å-thick $SiO_2$, dried at 70° C. for 5 minutes, and thermally cured at 185° C. for 1 hour to form an auxiliary layer having a thickness of 16 nm to 105 nm. Subsequently, on the auxiliary layer, an organic semiconductor (dibenzothiopheno[6,5-b:6',5'-f]thieno[3,2-b]thiophene, DTBTT) is vacuum vapor-deposited (0.1 Å/s) at a substrate temperature of 200° C. to form a 50 nm-thick semiconductor layer. Then, on the semiconductor layer, gold (Au) is deposited by using a shadow mask to form 1000 Å-thick source and drain electrodes and thus manufacture a thin film transistor.

Example 2

A thin film transistor is manufactured according to the same method as Example 1 except that the coating liquid of Synthesis Example 2 instead of the coating liquid of Synthesis Example 1 is used to form an auxiliary layer.

Comparative Example 1

A thin film transistor is manufactured according to the same method as Example 1 except that the auxiliary layer is not formed.

Evaluation II

Electrical characteristics of the thin film transistors according to Examples and Comparative Example are evaluated.

The electrical characteristics are evaluated from a dielectric constant and charge mobility.

The dielectric constant is measured by making an MIM structure (metal-insulator-metal) which is a sandwich structure formed by disposing an insulator between electrodes and then, using a LCR meter (Manufacturer: Agilent Technologies).

The charge mobility of the thin film transistors is obtained by obtaining a graph having $(ISD)^{1/2}$ and VG as variables from a saturation region current equation and a slope in the graph.

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$slope = \sqrt{\frac{\mu C_0 W}{2L}}$$

$$\mu_{FET} = (slope)^2 \frac{2L}{C_0 W}$$

In the equations, ISD is a source-drain current, μ or μFET is charge mobility, C0 is electrostatic capacity of a gate insulating layer, W is a channel width, L is a channel length, VG is a gate voltage, and VT is a threshold voltage.

The results are shown in Table 2.

TABLE 2

| | Thickness of auxiliary layer (nm) | Dielectric constant | Charge mobility (cm²/Vs) |
|---|---|---|---|
| Example 1 | 25 | 3.87 | 6.27 |
| | 57 | 4.04 | 5.72 |
| | 82 | 4.12 | 5.86 |
| | 105 | 4.37 | 6.69 |
| Example 2 | 16 | 3.88 | 5.38 |
| | 41 | 3.99 | 4.18 |
| | 56 | 4.13 | 5.16 |
| | 76 | 4.35 | 4.90 |
| Comparative Example 1 | — | 3.90 | <1 |

Referring to Table 2, the thin film transistors according to Examples 1 and 2 show satisfactory electrical characteristics compared with the thin film transistor according to Comparative Example 1.

While this disclosure has been described in connection with what is presently considered to be practical example embodiments, it is to be understood that the inventive concepts are not limited to the disclosed embodiments. On the contrary, inventive concepts are intended to cover various modifications and equivalent arrangements included within the spirit and scope of the appended claims.

What is claimed is:

1. A thin film transistor comprising
a gate electrode;
a semiconductor layer overlapping the gate electrode;
a gate insulator between the gate electrode and the semiconductor layer;
a source electrode and a drain electrode electrically connected to the semiconductor layer; and
an auxiliary layer between the gate insulator and the semiconductor layer, the auxiliary layer including a polyorganosiloxane represented by Chemical Formula 1 or a cured product thereof,

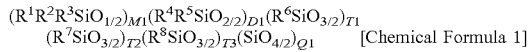

[Chemical Formula 1]

wherein, in Chemical Formula 1,
$R^1$ to $R^6$ are independently hydrogen, a substituted or unsubstituted $C_1$ to $C_{30}$ alkyl group, a substituted or unsubstituted $C_3$ to $C_{30}$ cycloalkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ heteroalkyl group, a substituted or unsubstituted $C_2$ to $C_{30}$ heterocycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a substituted or unsubstituted $C_1$ to $C_{30}$ epoxy group, a substituted or unsubstituted $C_1$ to $C_{30}$ carbonyl group, a substituted or unsubstituted $C_1$ to $C_{30}$ carboxyl group, a substituted or unsubstituted amide group, a hydroxyl group, or a combination thereof, provided that $R^6$ is different from $R^7$ and $R^8$,
$R^7$ is a $C_8$ to $C_{30}$ alkyl group or a $C_8$ to $C_{30}$ fluoroalkyl group,
$R^8$ is hydrogen or a $C_1$ to $C_3$ alkyl group,
$0 \leq M1 < 1$, $0 \leq D1 < 1$, $0 \leq T1 \leq 0.5$, $0 < T2 \leq 0.5$, $0 \leq T3 \leq 0.5$, $0 \leq Q1 < 1$, and
$M1+D1+T1+T2+T3+Q1=1$.

2. The thin film transistor of claim 1, wherein $R^7$ is represented by Chemical Formula 1a:

[Chemical Formula 1a]

wherein, in Chemical Formula 1a,
$R^a$ is hydrogen or $CF_3$,
n1 and n2 are independently an integer ranging from 0 to 30,
$8 \leq n1+n2 \leq 30$, and
* is a linking point with Si.

3. The thin film transistor of claim 2, wherein
n1 is an integer ranging from 5 to 20, and
n2 is an integer of 0 to 4.

4. The thin film transistor of claim 2, wherein $R^a$ is $CF_3$ and n1 is an integer of 5 to 20.

5. The thin film transistor of claim 1, wherein the polyorganosiloxane has a weight average molecular weight of about 1,000 to about 5,000.

6. The thin film transistor of claim 1, wherein the auxiliary layer contacts the semiconductor layer and the gate insulator, respectively.

7. The thin film transistor of claim 1, wherein the auxiliary layer has a thickness of about 10 nm to about 200 nm.

8. The thin film transistor of claim 1, wherein the semiconductor layer includes an organic semiconductor.

9. An electronic device comprising:
the thin film transistor of claim 1.

* * * * *